United States Patent [19]

Sanders

[11] 3,895,977

[45] July 22, 1975

[54] METHOD OF FABRICATING A BIPOLAR TRANSISTOR

[75] Inventor: Thomas J. Sanders, Indialantic, Fla.

[73] Assignee: Harris Corporation, Cleveland, Ohio

[22] Filed: Dec. 20, 1973

[21] Appl. No.: 426,584

[52] U.S. Cl. .......... 148/187; 317/235 Z
[51] Int. Cl. .......... H01l 7/34
[58] Field of Search .......... 317/235 Z; 148/185, 187

[56] References Cited

UNITED STATES PATENTS

| | | | |
|---|---|---|---|
| 3,543,102 | 11/1970 | Dahlberg | 317/235 Z |
| 3,629,017 | 12/1971 | Stork | 148/179 |
| 3,670,219 | 6/1972 | Frederiksen | 317/235 Z |
| 3,673,012 | 6/1972 | Kaiser | 148/187 |
| 3,676,229 | 7/1972 | Einthoven et al. | 148/186 |
| 3,761,787 | 9/1973 | Davis | 317/234 N X |

*Primary Examiner*—L. Dewayne Rutledge
*Assistant Examiner*—Arthur J. Steiner
*Attorney, Agent, or Firm*—Fidelman, Wolffe & Leitner

[57] ABSTRACT

An integrated circuit and fabrication thereof having bipolar transistors of approximately identical peak current gain and different current capacities. The peak current gain is a function of a fixed area emitter and current capacity is a function of the number of fixed area emitters used to form the individual transistor.

4 Claims, 3 Drawing Figures

METHOD OF FABRICATING A BIPOLAR TRANSISTOR

BACKGROUND OF THE INVENTION

1. Field of the Invention:

The present invention relates generally to integrated circuits having bipolar transistors and more specifically to integrated circuits having bipolar transistors of nearly equal peak current gain and varying current capacity.

2. Description of the Prior Art:

In the field of fabrication and design of integrated circuits, many types of bipolar transistor designs have been developed to meet and solve different problems. The design of high powered transistors has included multi-emitter or multi-base regions to greatly enhance the ability of the device to dissipate heat. Similarly, multi-emitter transistors have been designed to increase the emitter periphery per unit of emitter area so as not to decrease the high frequency performance of high power transistors. Thus, the prior art has found that by using multiple emitter regions in a single transistor, high powered transistors performance at high frequency are increased.

In many practical integrated circuits, several different transistors are used which are designed to operate at various current levels. This usually means that on a single integrated circuit chip, transistors having different emitter sizes will be employed to provide the varying current capacity transistors.

A common observation of the manufacturer of very small geometry bipolar transistors (i.e., emitter areas less than 1 mil.$^2$) is that the peak current gain of the transistor varies as a function of the emitter area. The peak current gain of a transistor may be expressed as follows:

$$\text{Peak Beta} = \frac{\alpha}{1-\alpha}$$

$$\alpha = \gamma\beta^*$$

$$\gamma \approx \frac{I_n}{I_p + I_n}$$

$$\beta^* \approx 1 - \frac{1}{4}\left(\frac{W}{L}\right)^2$$

wherein $I_n$ is the total electron current across Emitter-Base junction;

$I_p$ is the total hole current across Emitter-Base junction;

W is the Base Width;

L is the diffusion length of electrons in the base.

From the above equation, it is obvious that the maximum current gain or peak beta may be changed by varying the ratio of carrier concentrations in the emitter to that in the base, which varies the $I_n/I_p$. Another variable in the above equation is the base width (W), which is the difference between the base penetration and the emitter penetration. The other parameters are hard to vary and are normally left constant.

Studies have been performed and reported which show that the three-dimensional redistribution of impurities during a high temperature diffusion is a function of the geometry of the oxide aperture through which the diffusion is accomplished. It has been found that a diffusion goes deeper for a large aperture ($A_E$ greater than 1 mil$^2$) than it does for a small aperture ($A_E$ less than 0.1 mil$^2$) mask where $A_E$ is the emitter area. Thus, the variation of impurity distribution and the base width are a function of the oxide aperture through which the diffusion is accomplished and thus the variance of peak beta of transistors is a function of emitter area. The two articles showing these results are "Analysis of the Impurity Atom Distribution Near the Diffusion Mask for a Planar P-N Junction", by D. P. Kennedy and R. R. O'Brien, IBM Journal, May, 1965, p. 179–186 and "Resistance of Narrow Diffused Layers" by Takayuki Yanagawa in IEEE Transactions on Electron Devices, Vol. Ed. 19, No. 11, Nov. 1972, p. 1166–1171.

Thus, the prior art has failed to provide an integrated circuit having transistors of varying current capacities but of approximately identical peak current gain.

SUMMARY OF THE INVENTION

The present invention provides an integrated circuit and a method of fabricating same having bipolar transistors of approximately identical peak current gain but different current capacities. Since the peak current gain is a function of a fixed area emitter and current capacity is a function of total emitter area, the present invention uses a fixed area emitter, of less than 0.1 mil$^2$, to define the peak current gains of all transistors in the integrated circuit. To vary the current capacity of the various transistors in the circuit, one or more of the fixed area emitters are fabricated into a given transistor. Thus, an integrated circuit is produced having bipolar transistors of nearly identical peak current gains yet of different current capacities.

It is advantageous to have all the transistors in an integrated circuit of the same peak beta because they will all have the same gain-band width frequency ($f_t$), which is required for emitter coupled logic circuits and high frequency amplifiers. The gain-band width frequency may be expressed as:

$$\frac{1}{F_t} = K_1 + K_2 W^2$$

where $K_1$ and $K_2$ are constants which are dependent on other process parameters and where W is the base width of the transistor. Since the present invention produces identical peak beta transistors of varying current capacities by making all the base widths (W) the same, their gain-band width frequencies ($f_t$), are also identical.

Similarly, identical base widths will cause the transistors in the integrated circuit to have the same peak beta degradation under neutron radiation, which is necessary for radiation hardened circuits. This relationship is shown as:

$$\frac{\text{Beta before radiation}}{\text{Beta after radiation}} = 1 + K_3 W^2 \phi$$

where $\phi$ = neutron fluency, and $K_3$ = constant which is dependent on other process parameters.

OBJECTS OF THE INVENTION

An object of the present invention is to provide an integrated circuit wherein bipolar transistors have approximately identical current gains.

Another object of the present invention is to produce an integrated circuit having bipolar transistors of approximately identical peak current gains and different current capacities.

A further object of the invention is to provide a method for fabricating integrated circuits having transistors of approximately identical peak current gains.

Other objects, advantages and novel features of the present invention will become apparent from the following detailed description of the invention when considered in conjunction with the accompanying drawings.

DETAILED DESCRIPTION OF PREFERRED EMBODIMENT

Figure 1:
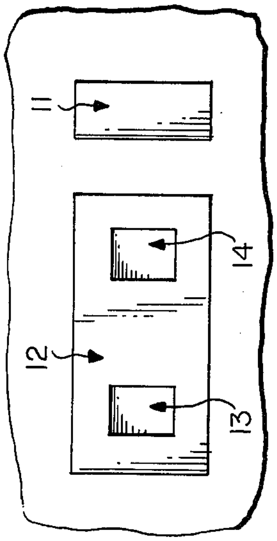
FIG. 1 is a top view of a single fixed area emitter transistor of the present invention.

FIG. 1 shows the surface geometry of a minimum geometry transistor which may be used in an integrated circuit. Region surface 10 is the collector contact, region surface 12 is the based diffusion area, region surface 13 is the base contact and region surface 14 is the emitter diffusion area and the emitter contact aperture. A wash emitter structure is shown in this Figure, but other emitter structures may be used. In application in an integrated circuit, each of the contact areas 10, 13 and 14 are connected to separate metal lines which run to other parts of the circuit.

The emitter 14 has the length and width of approximately 4 microns (about 0.15 mils), a depth of 0.3 microns and a concentration and resistance of $10^{21}$ atoms/cc and 5 ohms per square, respectively. Base 12 has a concentration of $10^{18}$ atoms/cc and a resistance of 500 ohms per square. The collector 10 has a concentration of $10^{16}$ atoms/cc and a resistance of 0.5 ohm - centimeter.

Figure 3:
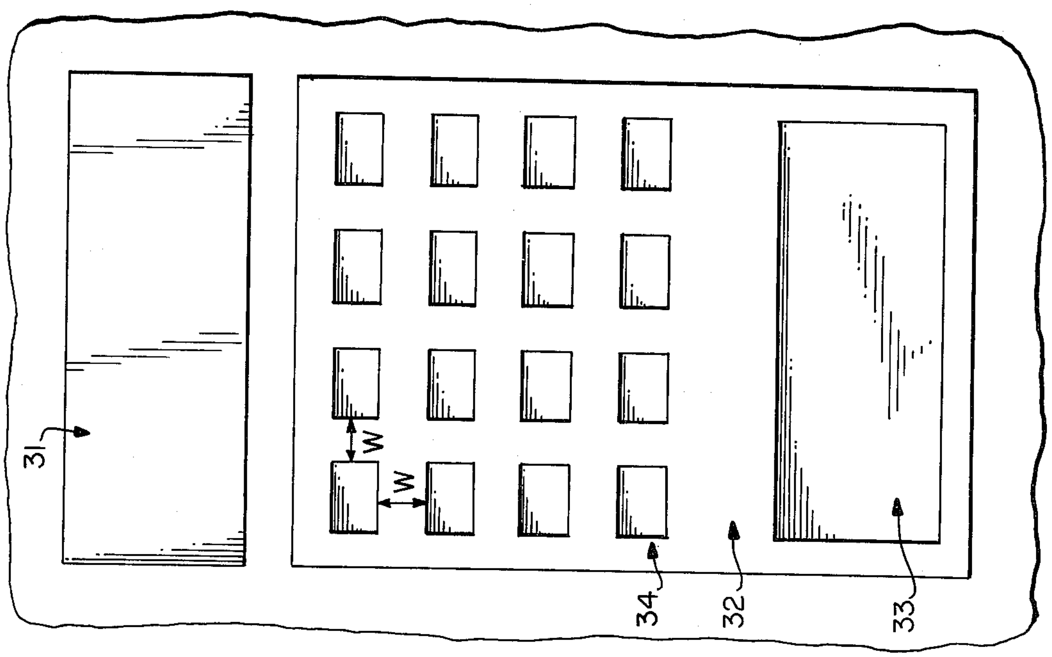
FIG. 3 is a top view of a sixteen fixed area emitter transistor of the present invention.
Figure 2:
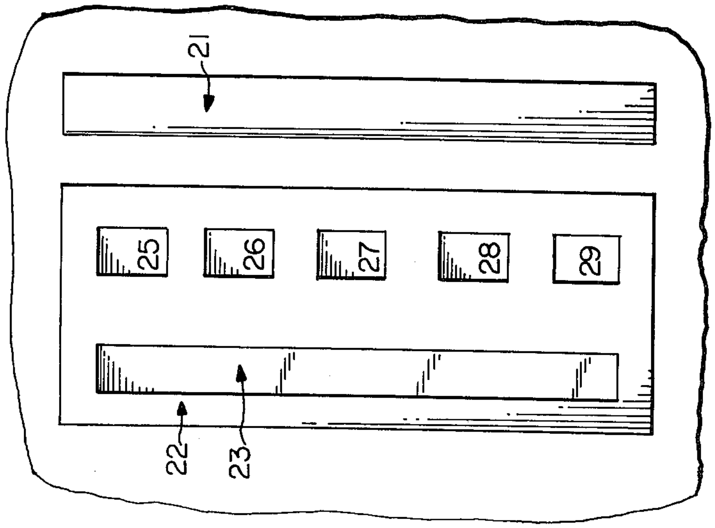
FIG. 2 is a top view of a five fixed area emitter transistor of the present invention.

A bipolar transistor illustrated in FIGS. 1–3 is formed in the usual manner, starting with a substrate and using open tube diffusion through oxide mask to form the base region and the emitter regions and base and collector contact regions. A minimum geometry transistor of FIG. 1 is formed through apertures having an area of less than 0.1 $mil^2$. On the same integrated circuit may appear a bipolar transistor requiring five times the current capacity of the minimum geometry bipolar transistor of FIG. 1. To produce such a transistor having a larger current capacity, while maintaining the peak current gain approximately identical, the required emitter area is divided into multiples of a minimum geometry emitter of FIG. 1. Such a transistor is illustrated in FIG. 2 as having collector contact 21, base 22, base contact 23 and five emitters 25, 26, 27, 28 and 29. Each emitter has an identical shape and size to the minimum geometry emitter 14. Therefore, the maximum beta or current gain of the device in FIG. 2 will be the same or approximately identical to the minimum geometry transistor of FIG. 1. However, to achieve the higher current capability, all of the emitter regions 25–29 are connected together with interconnect metals. The peak current identity between the devices of FIGS. 1 and 2 is achieved by using identical geometry oxide apertures through which the diffusion of the emitter regions is accomplished. By increasing the number of these fixed area emitter regions formed in the transistor, the current capacity of the transistor can be enlarged without changing the maximum beta.

Another application of the present technique is in the design of an "in process" test transistor for integrated circuits. To make the in process measurement of the beta of this transistor easy, a very large emitter is normally employed. To make the characteristics of this test transistor identical to those of the minimum geometry transistor of FIG. 1, the transistor geometry shown in FIG. 3 can be used. The transistor has a collector contact region 31, a base 32 and a base contact region 33. A plurality (sixteen) of emitter regions, each having identical shape and size to the minimum geometry emitter 14 of FIG. 1. Suggested spacing of the plural emitters of the transistor in FIG. 2 and in FIG. 3 is four microns or 0.15 mils. As is the case in the fabrication of the transistor of FIG. 2, the emitters of the transistor of FIG. 3 are produced through an oxide mask using an open tube diffusion. If desired, the spacing between the individual emitters in the oxide mask may be very small, such as 0.5 microns for example, and thus the individual emitters would diffuse together at the surface. This diffusion would not effect the peak current gain of the transistors since the emitter regions were formed through fixed area apertures in an oxide mask. If the emiters do not diffuse together, probing can still be easy if a sharp probe is used to contact the emitter regions.

The process of the present invention provides high current transistors of large emitter area and small current transistors of small emitter areas on the same integrated circuit chip with approximately identical peak current gain or beta. This is possible when each emitter opening on the chip is the identical size. Thus, a small current transistor having one emitter opening and a large current transistor having a plurality of emitter openings, each being of identical size to the opening in the small current transistor, will have the same impurities distribution and base width which will result in approximately identical peak betas.

Though the transistors illustrated in FIGS. 1–3 have been suggested to be formed by open diffusion, the base, base contact and collector contacts may be formed by other processes. Similarly, the transistors may be PNP's or NPN's.

What is claimed is:

1. A process for fabricating transistors having approximately identical peak current gain, but different current capacities comprising the steps of:

forming base regions of first current capacity transistor and second current capacity transistor by diffusion;

forming an emitter region of said first current capacity transistor of a given effective area and an emitter region of said second current capacity transistor of a larger effective area than said given area so that both of said emitter regions have substantially identical impurity distribution by impurity deposition and diffusion through a mask having a plurality of identical area apertures; and forming collector contact regions of said first and second current capacity transistors by diffusion.

2. A process as in claim 1 wherein said emitter region of said second current capacity transistor is formed as a plurality of discrete emitter areas by a plurality of said identical area apertures in said mask.

3. A process as in claim 1 wherein forming said emitter region of said second current capacity transistor includes diffusing through a mask with identical fixed area apertures spaced sufficiently close together to produce a continuous emitter with an impurity distribution approximately identical to said first current capacity transistor.

4. A process as in claim 1 wherein said apertures are squares having an area of less than 0.1 $mil^2$.

* * * * *